(12) United States Patent
Bruening et al.

(10) Patent No.: US 11,166,384 B2
(45) Date of Patent: Nov. 2, 2021

(54) FABRICATION PROCESS FOR FLIP CHIP BUMP BONDS USING NANO-LEDS AND CONDUCTIVE RESIN

(71) Applicant: KONICA MINOLTA LABORATORY U.S.A., INC., San Mateo, CA (US)

(72) Inventors: Karsten Bruening, Portola Valley, CA (US); Jun Amano, Hillsborough, CA (US)

(73) Assignee: KONICA MINOLTA LABORATORY U.S.A., INC., San Mateo, CA (US)

(*) Notice: Subject to any disclaimer, the term of this patent is extended or adjusted under 35 U.S.C. 154(b) by 379 days.

(21) Appl. No.: 16/359,125

(22) Filed: Mar. 20, 2019

(65) Prior Publication Data
US 2020/0305288 A1    Sep. 24, 2020

(51) Int. Cl.
| | | |
|---|---|---|
| *H05K 3/40* | (2006.01) | |
| *H05K 3/30* | (2006.01) | |
| *H01L 33/32* | (2010.01) | |
| *H01L 33/24* | (2010.01) | |

(Continued)

(52) U.S. Cl.
CPC ......... *H05K 3/4007* (2013.01); *H05K 3/303* (2013.01); *H01L 27/156* (2013.01); *H01L 33/24* (2013.01); *H01L 33/32* (2013.01); *H05K 1/181* (2013.01); *H05K 2201/0215* (2013.01); *H05K 2201/0221* (2013.01); *H05K 2201/10674* (2013.01); *H05K 2203/0783* (2013.01)

(58) Field of Classification Search
CPC ...... H05K 3/303; H05K 3/4007; H05K 1/181; H05K 2201/0215; H05K 2201/0221; H05K 2201/10674; H05K 2203/0783; H01L 27/156; H01L 33/24; H01L 33/32
See application file for complete search history.

(56) References Cited

U.S. PATENT DOCUMENTS

| | | | |
|---|---|---|---|
| 3,818,279 A * | 6/1974 | Seeger, Jr. ............. | H05K 1/118 361/751 |
| 5,196,371 A | 3/1993 | Kulesza et al. | |
| 5,431,328 A | 7/1995 | Chang et al. | |

(Continued)

FOREIGN PATENT DOCUMENTS

WO    WO-2015193434 A2 * 12/2015 ................ F21V 9/08

OTHER PUBLICATIONS

Wu et al., "Properties investigation on isotropical ocnductive adhesives filled with silver coated carbon nanotubes", Composites and Science Technology, #67, 2007, pp. 1182-1186.*

(Continued)

*Primary Examiner* — Peter Dungba Vo
*Assistant Examiner* — Jeffrey T Carley
(74) *Attorney, Agent, or Firm* — Chen Yoshimura LLP

(57) ABSTRACT

A fabrication method achieves bump bonds (to connect two electronic devices) with a pitch of less than 20 μm using UV-curable conductive epoxy resin cured with an array of nano-LEDs. Nano-LEDs are devices with sizes less than or equal to 5 μm, typically arranged in an array. After deposition of the uncured conductive epoxy layer, the nano-LED array enables a fast curing of the bumps with high spatial resolution. Next, the uncured resin is washed off and the chips are assembled, before final thermal curing takes place.

20 Claims, 2 Drawing Sheets

(51) Int. Cl.
*H01L 27/15* (2006.01)
*H05K 1/18* (2006.01)

(56) References Cited

U.S. PATENT DOCUMENTS

| | | | |
|---|---|---|---|
| 6,365,500 | B1 | 4/2002 | Chang et al. |
| 6,561,640 | B1* | 5/2003 | Young ................... B41J 11/002 |
| | | | 347/102 |
| 8,012,801 | B2* | 9/2011 | Karashima ............ H01L 21/563 |
| | | | 438/108 |
| 2004/0135159 | A1* | 7/2004 | Siegel ................. B41F 23/0409 |
| | | | 257/88 |
| 2009/0176112 | A1* | 7/2009 | Kruckenberg ........ B29C 70/081 |
| | | | 428/457 |
| 2009/0301771 | A1* | 12/2009 | Ochi ....................... H01L 24/11 |
| | | | 174/260 |
| 2016/0073496 | A1* | 3/2016 | Vincent ................ H05K 1/0218 |
| | | | 361/772 |
| 2018/0237618 | A1* | 8/2018 | Mu ............................ C09J 9/02 |

OTHER PUBLICATIONS

Hansen et al., "Fluxless flip-chip bonding using a lead-free solder bumping technique", Journal of Instrumentation, vol. 12, T09006, 2017, pp. 1-25.
Glaus et al., "Development of an Indium Bump Bond Process for Silicon Pixel Detectors at PSI", Nuclear Instruments and Methods in Physics Research, vol. 565, No. 1, pp. 303-308, Jan. 6, 2006, https://arxiv.org/abs/physics/0510021v2.
Bhushan et al., "Two-photon absorption spectrum of silver nanoparticles", Optics Communications, vol. 285, No. 24, pp. 5420-5424, 2012.
Cytodiagnostics Inc., "Silver Nanoparticle Properties", http://www.cytodiagnostics.com/store/pc/Silver-Nanoparticle-Properties-d11.htm, 3 pages, printed from the Internet on Apr. 5, 2019.
Epoxy Technology, Inc., "Epo-tek E3001 Techinical Data Sheet", http://www.epotek.com/site/administrator/components/com_products/assets/files/Style_Uploads/E3001.pdf, 2 pages, printed from the Internet on Apr. 8, 2019.
Kornain et al., "Effect of Treated Silver Nanoparticles to Electrical Conductivity Improvement of Electrically Conductive Adhesive (ECA)," in ICSE Proceedings, 2008, pp. 549-553.
NDT Resource Center, "Conductivity and Resistivity Values for Misc. Materials", 2002, https://www.nde-ed.org/GeneralResources/MaterialProperties/ET/Conductivity_Misc.pdf, 8 pages, printed from the Internet on Apr. 8, 2019.
Caselle et al., "Low-cost bump-bonding processes for high energy physics pixel detectors", Journal of Instrumentation, vol. 11, No. 1, C01050, Jan. 2016.
Wikipedia, "Carbon 3d.", https://en.wikipedia.org/wiki/Carbon_(company), 3 pages, printed from the Internet on Apr. 5, 2019.
Sutanto et al., "Novel First-Level Interconnect Techniques for Flip Chip on MEMS Devices", Journal of Microelectromechanical Systems, vol. 21, No. 1, pp. 132-144, Nov. 3, 2011.
Piner et al., ""Dip-Pen" Nanolithography", Science, vol. 283, Jan. 29, 1999.

* cited by examiner

First stage: Coating of PCB with conductive resin

Second stage: Selective curing of conductive resin using nano-LED array

Third stage: Removal of uncured resin using solvent

Fourth stage: Assembly of second device

Fifth stage: Thermal curing of conductive resin

First stage:
Coating of PCB
with multilayers of
conductive resin

Second stage:
UV curing

Third stage:
Removal of uncured
resin by washing

FABRICATION PROCESS FOR FLIP CHIP BUMP BONDS USING NANO-LEDS AND CONDUCTIVE RESIN

BACKGROUND OF THE INVENTION

Field of the Invention

This invention relates to a process of fabricating bump bonds to electrically and mechanically connect two electronic components. In particular, it relates to a process of fabrication of flip chip bump bonds using nano-LEDs and conductive resin.

Description of Related Art

With increasing miniaturization, demand for smaller bump bonds (e.g. pitch <50 µm) is growing. For instance, pixel sizes in hybrid pixel X-ray detectors are approaching less than 20 µm, with each pixel requiring a connection to an ASIC (application-specific integrated circuit) that contains the readout electronics. In consumer electronics, such as mobile devices, the density of components is expected to increase as well.

Bump bonding is a method used to connect two semiconductor devices, such as integrated circuit chips and sensors. Conventionally, these bumps are made from solder. The solder is applied to one device, then the two devices are assembled and the solder is remelted (reflow) to make contact with the second device. Using conventional tin-bismuth solder, the pitch of these bumps is typically larger than 100 µm. To achieve finer pitch, tin-silver solder or indium can be used instead of tin-based solder. Alternatively, gold studs can be used instead of solder bumps, or metal spheres are jetted onto the chip and a laser is used to fuse the sphere to the chip. For instance, indium bump bonding has been used to achieve a 55 µm pitch in some detectors. The finest pitch accomplished by production scale sphere jetting stands at 40 µm. Most conventional fabrication processes for small metallic bumps require sophisticated lithography and complex etching process. Conventional bump bonding techniques are relatively expensive (e.g. compared to the sensor and the ASIC) and only gradual improvements in pitch have been made.

SUMMARY

Accordingly, the present invention is directed to a method and related apparatus for fabricating flip chip bump bonds that substantially obviates one or more of the problems due to limitations and disadvantages of the related art.

An object of the present invention is to form bump bonds with fine pitches while eliminating the complex lithography and etching process of the conventional small bump fabrication methods.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve the above objects, embodiments of the present invention provide a fabrication process that uses a conductive epoxy resin cured by small ultraviolet (UV) LEDs to form the bumps.

In one aspect, the present invention provides a method of fabricating bump bonds to mechanically and electrically connect a first electrical component with a second electrical component, the method including: coating a surface of the first electrical component with a layer of an electrically conductive resin; illuminating the resin layer at selected locations using light emitted by a light emitting diode (LED) device to partially cure the resin at the selected locations; removing uncured resin from the surface of the first electrical component using a solvent to form a plurality of bumps of partially cured resin; assembling the first and second electrical components by placing the second component over the first electrical component on the bumps; and thermally curing the resin to form bumps that mechanically and electrically connect the first and second electrical components.

In some embodiments, the electrically conductive resin includes a dual-cure epoxy resin filled with electrically conductive particles such as silver nanoparticles or silver coated carbon nanoparticles.

In some embodiment, the LED device is an LED array having a plurality of LEDs, each LED having a size of less than 5 µm.

It is to be understood that both the foregoing general description and the following detailed description are exemplary and explanatory and are intended to provide further explanation of the invention as claimed.

DETAILED DESCRIPTION OF PREFERRED EMBODIMENTS

Embodiments of the present invention relates to a process of making bump bonds to electrically and mechanically connect two chips, a sensor and a chip or two other electronic components. By using UV-curable conductive resin (e.g. epoxy resin) cured with an array of nano-LEDs, this process can achieve bump bonds with a pitch of less than 10 µm. This process is also simpler and more customizable than conventional processes.

Nano-LEDs are light emitting diodes with sizes ranging from less than $1 \times 1$ µm$^2$ to $20 \times 20$ µm$^2$, typically arranged in an array (e.g. 8×8, or any suitable size) with a pitch ranging from less than 1 µm to 20 µm. Nano-sized LEDs are typically based on gallium nitride nanowires. As of 2019, nano-LED arrays are on the verge of commercialization by multiple startups. With a bandgap of 3.4 eV, GaN typically emits in the UV range around 365 nm, which makes it a good fit to excite UV-activated photoinitiators in UV-curable epoxy resins (e.g. substituted benzophenones). Alloying GaN with Al increases the bandgap and leads to emission in deeper UV.

A fabrication process according to embodiments of the present invention uses a dual-cure conductive resin (e.g. epoxy resin) cured by small UV LEDs to form the bumps. After deposition of the uncured conductive resin layer on one device, the nano-LED array is used to perform a fast curing of the bumps with high spatial resolution. Next, the uncured resin is washed off, and the second device is assembled with the first device, before final thermal curing takes place to establish a solid bond between the devices.

Figure 1:
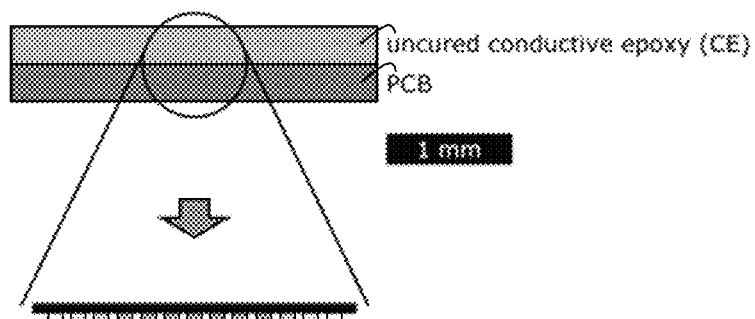
FIG. 1 schematically illustrates a process of fabricating flip chip bump bonds using a conductive resin and nano-LED illumination according to embodiments of the present invention.
Figure 1:
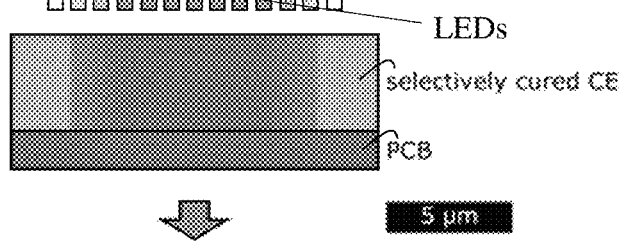
Figure 1:
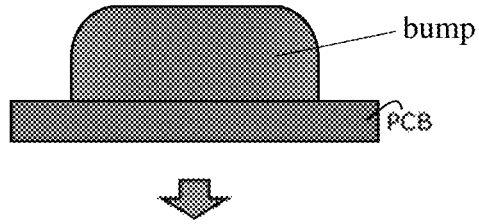
Figure 1:
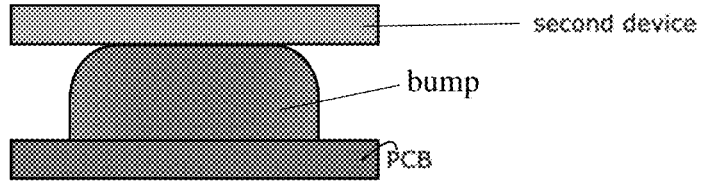
Figure 1:
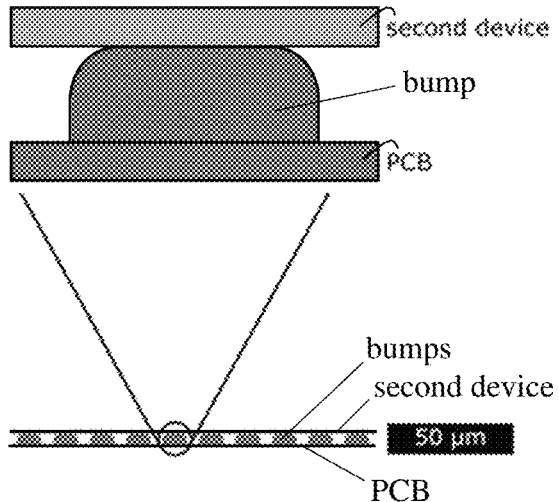

The fabrication process is described in more detail below with reference to FIG. 1. As shown in FIG. 1, the fabrication process includes five stages. In the first stage, an uncured electrically conductive resin (conductive epoxy in this example) is coated on the flat surface of a first one of the two electronic components to be connected. The first electronic component may be, for example, a printed circuit board (PCB). Preferably, the thickness of the conductive resin layer (i.e., the bump heights to be formed) is under 5 µm. Coating may be done by any suitable methods, such as spin coating, slot die coating, blade coating, spray coating, etc.

The electrically conductive resin is formed of a resin filled with electrically conductive particles at a concentration above the percolation threshold. The resin is a dual-cure resin, i.e., one that requires two curing steps to be fully cured. In embodiments of the present invention, the two curing steps are a UV curing step and a thermal curing step. The resin may be, for example, an epoxy resin. In one example, the dual-cure resin is a mixture that contains bisphenol A diglycidyl ether, amine or anhydride hardener, oligomeric acrylates, partially and fully acrylated epoxy oligomer (to provide bond between photocured and heat cured networks), photoinitiators (e.g. benzophenone derivatives), and additives (e.g., accelerators, etc.).

In one embodiment, the electrically conductive particles are silver nanoparticles with a size on the order of 10 to 100 nm. For example, recently epoxy resins filled with silver nanoparticles (on the order of 70 nm diameter) have been reported to have a resistivity as low as 2e-3 Ohm*m, if silane coupling agents are used and the filler content exceeds the percolation threshold (~5 vol. %). See Z. Kornain et al., Effect of Treated Silver Nanoparticles to Electrical Conductivity Improvement of Electrically Conductive Adhesive (ECA), in ICSE Proceedings, 2008, pp. 549-553. In another embodiment, the conductive particles are silver coated carbon particles, which can optimize the tradeoff between UV-absorption and electrical conductivity. More generally, the conductive particles are selected to have sufficiently high electrical conductivity and sufficiently low absorption of the UV light used in the curing steps so as to achieve a more uniform UV absorption. If silver particles are used in the conductive resin, UV light around 320 nm wavelength is advantageous in order to reduce UV absorption by silver. The size of the particles is selected based on considerations of reducing light scattering and ensuring conductivity. The particle size should be less than 1/10 of the wavelength of the UV light to reduce scattering, but should be sufficiently large to ensure percolation. Preferably, the concentration of the conductive particles is only slightly above the percolation threshold.

In the second stage, a nano-LED array (chip) mounted on a high-precision gantry is used to irradiate the conductive resin coating with a light, such as a UV light. The resin is cured at selected locations with high spatial resolution and precision by scanning the nano-LED array across the coated surface of the first electronic component. The intensity of the UV light and the time duration of the UV curing are selected based on the resin used. For example, for the above-described epoxy resin, the intensity of the UV light is about 1 to 100 mJ/mm$^2$ and the curing time is about less than 1 second to 1 minute. This step will be described in more detail later.

In the third stage, the uncured resin is removed (stripped away) using a suitable solvent, leaving the partially cured bumps at the selected locations. Here, "partially cured" refers to the fact that the resin requires two curing steps to be fully cured. The solvent may be, for example, propylene glycol methyl ether acetate or dichloromethane. In the fourth stage, the second one of the two electronic components to be connected is assembled with the first component, by placing the second component over the first component on the bumps, using an assembly station. In the fifth stage, final curing is achieved using thermal energy. The assembled components with the bumps are placed in a thermal curing station at a suitable temperature for a suitable time duration to thermally cure the resin. The curing conditions are selected based on the resin used. For example, for the above-described epoxy resin, the curing temperature is about 80° C. to 200° C. and the curing time is about 1 minute to 30 minutes. This forms the fully cured resin bumps, establishing a robust electrical and mechanical bond between the two electrical components.

A zoomed-out view of the bump array and the two electrical components are shown at the bottom of FIG. 1. In FIG. 1, the scale bars are 1 mm for the first stage, 5 µm for the second to fifth stages, and 50 µm for the zoomed out panel at the bottom. Note that these scale bars are meant to represent the order of magnitude for illustration purposes; actual dimensions of the various components may vary.

As mentioned earlier, the UV curing in the second stage is performed by scanning a nano-LED array mounted on a high-precision gantry. The smallest size of bumps that can be formed is determined by the smallest size of the nano-LED devices, which is currently about 1×1 µm$^2$ or less. There is no upper limit on the size of the bumps, as LEDs may be arranged to form arrays of any desired size; moreover, the gantry may be used to move the LED arrays to any desired position, so bumps larger than the LED array size may be formed. In some embodiments, the LED array has an overall lateral size that is approximate equal to or slightly larger than the size of the bumps to be formed; the LED array is scanned to the position of each bump and then turned on for a suitable time duration. For example, in one embodiment, the nano-LEDs are gallium nitride nanowires arranged in an 8×8 array; the size of each nano-LED is approximately 500×500 nm$^2$, and the size of the array is approximately 4×4 µm$^2$. The size of the bumps formed by such an LED array is approximately 4×4 µm$^2$. It should be noted that the invention is not limited to any particular size of the LEDs or LED arrays.

In some embodiments, the LED array has a larger area than the bumps to be formed, and the LEDs in the array can be individual controlled to turn on and off and/or to change intensity. This way, the lateral (i.e. in the plane parallel to the surface of the devices) size and shape of the bumps may be controlled by individually controlling the LEDs. For example, in the illustrated example of FIG. 1 (second stage), two LEDs at the edges are shown as being turned off to control the size of the bump. In another example (not shown), only a 4×4 sub-array of LEDs are turned on, and a smaller bump is formed as a result. In another example, multiple sub-arrays of LEDs may be selectively turned on to form multiple bumps within the area of each LED array, which can increase the throughput of the process and/or achieve higher spatial resolution of the bump array. For example, a larger LED array (e.g. 16×16, etc.) may be used and only four 4×4 sub-arrays are turned on at a time, forming four bumps at once.

In other alternative embodiments, the individual LEDs in the array may be arranged in a desired spatial pattern to form bumps of designed shapes. This design may be used so that even when the individual LEDs within an LED array (chip) are not capable of being turned on and off individually, desired shapes of the bumps can be achieved.

Figure 2:
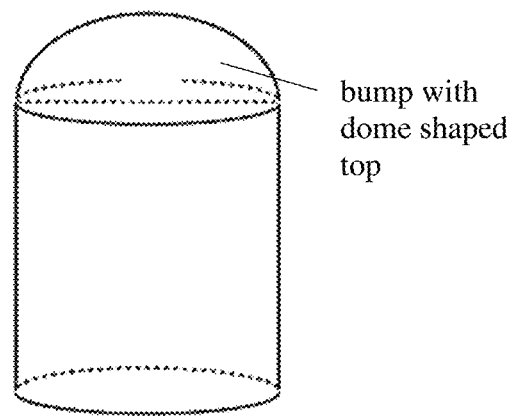
FIG. 2 schematically illustrates a bump with a dome shaped top.
Figure 3:
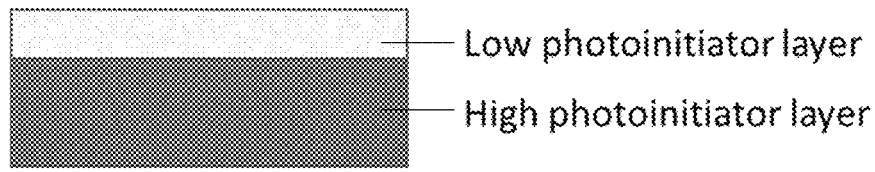
FIG. 3 schematically illustrates a multilayer resin process to obtain a shaped bump tip according to another embodiment of the present invention.
Figure 3:
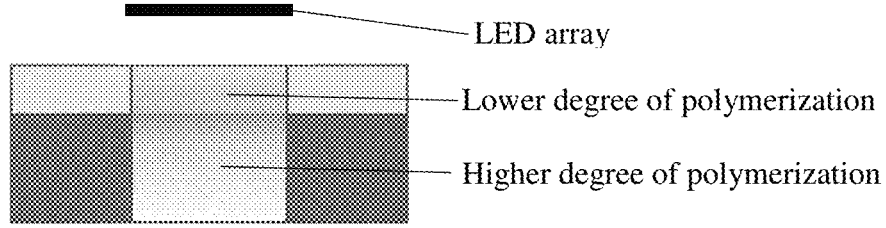
Figure 3:
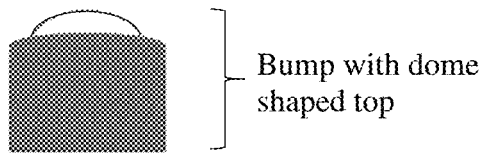

In addition to controlling the locations and the lateral size and shape of the bumps by adjusting the gantry and the on/off and intensity of the individual LEDs of the array, the cross-sectional shape of the individual bumps, in a cross-section perpendicular to the surface of the electrical component, may be controlled by using a multilayer resin process. For example, to achieve void-free bump connections, bumps with rounded upper edges (see FIG. 1) or with a dome shaped top (see FIG. 2) may be desired. In one embodiment, to form bumps with rounded upper edges or dome shaped tops, multiple sub-layers of resin with different photoinitiator concentrations are applied over the first electrical component in a modified first stage. In some implementations, consolidation (drying or curing) steps are performed between application of consecutive sub-layers. A two-layer example with a lower photoinitiator concentration in the top sub-layer is shown in FIG. 3. After UV curing (second stage), the degree of polymerization is lower in the top sub-layer than in the bottom sub-layer, making it more susceptible to be removed by solvent in the washing process. Thus, after washing in the third stage, a bump with a dome shaped top of rounded top edges is obtained due to higher washing rate at the edges of the top sub-layer. The shape of the top may be controlled by the gradient in photoinitiator concentration and the washing time. The fourth and fifth stages are unchanged (not shown in FIG. 3).

To summarize, the use of dual-cure conductive resin allows the bumps to be formed by selective UV curing and then by thermal curing after assembly. The method is particularly suitable for forming small bumps with heights of a few μm, as a larger thickness of the resin layer will prevent the UV light from reaching the bottom of the layer to cure the entire volume.

The fabrication process according to embodiments of the present invention provides a scalable, simple and cost-effective way to form bump bonds with similar or finer pitch than conventional technologies to interconnect semiconductor devices. Besides having finer pitch, the advantages of using conductive epoxy include high mechanical resilience (e.g. to accommodate mechanical or thermal stresses), low-temperature processability (e.g. to bond devices that cannot be exposed to high temperatures), and easy customizability.

It will be apparent to those skilled in the art that various modification and variations can be made in the flip chip bump bond fabrication method and related apparatus of the present invention without departing from the spirit or scope of the invention. Thus, it is intended that the present invention cover modifications and variations that come within the scope of the appended claims and their equivalents.

What is claimed is:

1. A method of fabricating bump bonds and mechanically and electrically connecting a first electrical component with a second electrical component, comprising:
   coating a surface of the first electrical component with a layer of an electrically conductive resin;
   illuminating the electrically conductive resin layer at selected locations using light emitted by a light emitting diode (LED) device to partially cure the electrically conductive resin at the selected locations, including scanning the LED device using a gantry across the coated surface of the first electronic component to the selected locations to illuminate the electrically conductive resin layer at the selected locations, while leaving the electrically conductive resin layer outside of the selected locations uncured;
   removing uncured electrically conductive resin from the surface of the first electrical component using a solvent, wherein the partially cured electrically conductive resin at the selected locations forms a plurality of partially cured resin bumps;
   assembling the first and second electrical components by placing the second component over the first electrical component on the partially cured resin bumps; and
   after the assembling step, thermally curing the partially cured resin bumps to form fully cured resin bumps that mechanically and electrically connect the first and second electrical components.

2. The method of claim 1, wherein the electrically conductive resin includes a dual-cure resin filled with electrically conductive particles.

3. The method of claim 2, wherein the dual-cure resin is an epoxy resin.

4. A method of fabricating bump bonds which mechanically and electrically connect a first electrical component with a second electrical component, comprising:
   coating a surface of the first electrical component with a layer of an electrically conductive resin, wherein the electrically conductive resin includes a dual-cure resin filled with electrically conductive particles, wherein the dual-cure resin is a mixture containing bisphenol A diglycidyl ether, amine or anhydride hardener, oligomeric acrylates, partially and fully acrylated epoxy oligomer, a photoinitiator, and an accelerator;
   illuminating the electrically conductive resin layer at selected locations using light emitted by a light emitting diode (LED) device to partially cure the electrically conductive resin at the selected locations, leaving the electrically conductive resin layer outside of the selected locations uncured;
   removing uncured electrically conductive resin from the surface of the first electrical component using a solvent, wherein the partially cured electrically conductive resin at the selected locations forms a plurality of partially cured resin bumps;
   assembling the first and second electrical components by placing the second component over the first electrical component on the partially cured resin bumps; and
   after the assembling step, thermally curing the partially cured resin bumps to form fully cured resin bumps that mechanically and electrically connect the first and second electrical components.

5. The method of claim 2, wherein the electrically conductive particles include silver particles having sizes between 10 nm and 100 nm or silver coated carbon particles.

6. The method of claim 1, wherein the layer of electrically conductive resin is less than 5 μm in thickness.

7. The method of claim 1, wherein the LED device emits an ultraviolet (UV) light.

8. The method of claim 1, wherein the LED device is an LED array having a plurality of LEDs, each LED having a size of less than 5 μm.

9. The method of claim 8, wherein the LEDs are formed of gallium nitride nanowires.

10. The method of claim 8, wherein the plurality of LEDs in the LED array are individually controllable to turn on and off or to control intensity, and wherein the illuminating step includes turning on some but not all of the LEDs in the LED array or individually controlling intensities of the LEDs.

11. The method of claim 8, wherein the plurality of LEDs in the LED array form a predefined spatial pattern, and wherein shapes of the partially cured resin bumps are determined by the spatial pattern of the LED array.

12. The method of claim 1, wherein the step of coating the flat surface of the first electrical component with the layer of the electrically conductive resin includes forming a first sub-layer of a first electrically conductive resin on the flat surface of the first electrical component and forming a second sub-layer of a second electrically conductive resin on the first sub-layer, wherein the second electrically conductive resin contains a lower concentration of photoinitiator than the first electrically conductive resin, and wherein the illuminating step is performed on both the first and second sub-layers at once.

13. The method of claim 1, wherein the first electrical component is a printed circuit board (PCB).

14. The method of claim 4, wherein the electrically conductive particles include silver particles having sizes between 10 nm and 100 nm or silver coated carbon particles.

15. The method of claim 4, wherein the layer of electrically conductive resin is less than 5 μm in thickness.

16. The method of claim 4, wherein the LED device emits an ultraviolet (UV) light.

17. The method of claim 4, wherein the LED device is an LED array having a plurality of LEDs, each LED having a size of less than 5 μm, and wherein the plurality of LEDs in the LED array form a predefined spatial pattern.

18. The method of claim 17, wherein the LEDs are formed of gallium nitride nanowires.

19. The method of claim 17, wherein the plurality of LEDs in the LED array are individually controllable to turn on and off.

20. The method of claim 4, wherein the step of coating the flat surface of the first electrical component with the layer of the electrically conductive resin includes forming a first sub-layer of a first electrically conductive resin on the flat surface of the first electrical component and forming a second sub-layer of a second electrically conductive resin on the first sub-layer, wherein the second electrically conductive resin contains a lower concentration of photoinitiator than the first electrically conductive resin.

* * * * *